(12) United States Patent  
Wang et al.

(10) Patent No.: US 10,706,189 B2  
(45) Date of Patent: Jul. 7, 2020

(54) SYSTEMS AND METHOD FOR DYNAMIC COMBUSTION TESTS

(71) Applicant: General Electric Company, Schenectady, NY (US)

(72) Inventors: Liping Wang, Halfmoon, NY (US); Isaac Mendel Asher, Saratoga Springs, NY (US); You Ling, Schenectady, NY (US); Ankur Srivastava, Chicago, IL (US); Arun Karthi Subramaniyan, Clifton Park, NY (US)

(73) Assignee: General Electric Company, Schenectady, NY (US)

( * ) Notice: Subject to any disclaimer, the term of this patent is extended or adjusted under 35 U.S.C. 154(b) by 514 days.

(21) Appl. No.: 15/445,334

(22) Filed: Feb. 28, 2017

(65) Prior Publication Data

US 2018/0246504 A1    Aug. 30, 2018

(51) Int. Cl.
*G06F 30/20*      (2020.01)
*G01M 15/14*      (2006.01)
*G05B 23/02*      (2006.01)

(52) U.S. Cl.
CPC ............. *G06F 30/20* (2020.01); *G01M 15/14* (2013.01); *G05B 23/0218* (2013.01)

(58) Field of Classification Search
CPC .... G06F 17/5009; G06F 30/20; G01M 15/14; G05B 23/0218
USPC ........................................................ 702/123
See application file for complete search history.

(56) References Cited

U.S. PATENT DOCUMENTS

| | | | |
|---|---|---|---|
| 4,455,614 A | 6/1984 | Martz et al. | |
| 6,085,132 A * | 7/2000 | Ishii | F02D 41/266 123/479 |
| 6,845,307 B2 | 1/2005 | Rother | |
| 7,457,710 B2 | 11/2008 | Paschereit et al. | |
| 7,493,767 B2 | 2/2009 | Bunker et al. | |
| 8,793,004 B2 | 7/2014 | Grichnik et al. | |
| 9,846,107 B1 * | 12/2017 | D'Amico | G01M 17/00 |
| 2009/0204376 A1 | 8/2009 | Keuth et al. | |

(Continued)

OTHER PUBLICATIONS

Hannett et al., "Combustion Turbine Dynamic Model Validation From Tests", IEEE Transactions on Power Systems, vol. 8, Issue 1, pp. 152-158, Feb. 1993.

(Continued)

*Primary Examiner* — Eman A Alkafawi
(74) *Attorney, Agent, or Firm* — Armstrong Teasdale LLP (57) ABSTRACT

A testing system computer device for dynamically updating a test plan of an apparatus includes at least one processor in communication with at least one memory device. The testing system computer device is configured to store a plurality of historical data and generate a simulation model of the apparatus based in part on the historical data. The simulation model includes a plurality of inputs and a plurality of outputs of the apparatus. The testing system computer device is also configured to determine a plurality of tests to perform on the apparatus based on the simulation model and the plurality of historical data. The testing system computer device is further configured to receive a plurality of desirability ratings from a user, rank the plurality of tests to perform based on the plurality of desirability ratings, and present the ranked plurality of tests to the user.

21 Claims, 8 Drawing Sheets

(56) References Cited

U.S. PATENT DOCUMENTS

2012/0323499 A1* 12/2012 Yelin .................. G06Q 10/10
  702/24
2015/0096287 A1* 4/2015 Qi ...................... F01N 3/208
  60/286

OTHER PUBLICATIONS

Fu et al., "Lean Burn Combustion Monitoring Strategy Based on Data Modelling", IEEE Aerospace Conference, Mar. 5-12, 2016.
Kassa et al., "A GA-BP Hybrid Algorithm Based ANN Model for Wind Power Prediction", IEEE Smart Energy Grid Engineering, Aug. 21-24, 2016.
Jassmann et al., "Model Predictive Wind Turbine Control and Load Alleviation and Power Leveling in Extreme Operation Conditions", IEEE Conference on Control Applications (CCA), Sep. 19-22, 2016.

* cited by examiner

SYSTEMS AND METHOD FOR DYNAMIC COMBUSTION TESTS

BACKGROUND

The field of the disclosure relates generally to dynamic combustion tests and, more particularly, to systems and method for dynamically updating test plans for combustion devices.

When a combustion engine, such as a turbine or jet engine is manufacturer or installed, there are multiple tests that are required to be performed to ensure that the combustion engine is working properly and within desired tolerances. Many of these tests are time consuming and/or expensive.

The collection of tests is collectively called a test plan. In many cases, the test plan contains heuristic test blocks or groups of tests, which are determined based on operation experience and expert judgment. However, this heuristic planning approach may lead to inefficient and/or redundant allocation of test resources. Some of these test plans are designed to investigate no more than two factors at a time. And many of these test plans do not leverage legacy or existing data. Accordingly, there is a need for enhanced test planning to improve efficiency and resource allocation, while controlling testing costs.

BRIEF DESCRIPTION

In one aspect, a testing system computer device for dynamically updating a test plan of an apparatus is provided. The testing system computer device includes at least one processor in communication with at least one memory device. The testing system computer device is configured to store a plurality of historical data and generate a simulation model of the apparatus based in part on the historical data. The simulation model includes a plurality of inputs and a plurality of outputs of the apparatus. The testing system computer device is also configured to determine a plurality of tests to perform on the apparatus based on the simulation model and the plurality of historical data, receive a plurality of desirability ratings from a user, rank the plurality of tests to perform based on the plurality of desirability ratings, and present the ranked plurality of tests to the user.

In another aspect, a method for dynamically updating a test plan of an apparatus is provided. The method is implemented using a testing system computer device. The testing system computer device includes a processor in communication with a memory. The method includes storing, in memory, a plurality of historical data and generating, by the processor, a simulation model of the apparatus based in part on the historical data. The simulation model includes a plurality of inputs and a plurality of outputs of the apparatus. The method also includes determining, by the processor, a plurality of tests to perform on the apparatus based on the simulation model and the plurality of historical data, receiving, by the processor, a plurality of desirability ratings from a user, ranking, by the processor, the plurality of tests to perform based on the plurality of desirability ratings, and presenting the ranked plurality of tests to the user.

In yet a further aspect, a system for dynamically updating a test plan of an apparatus is provided. The system includes a plurality of sensors attached to the apparatus to be tested. Each sensor of the plurality of sensors is configured to measure an attribute of the apparatus. The system also includes a testing controller in communication with the plurality of sensors. The testing controller includes a processor in communication with a memory. The testing controller is programmed to control a plurality of inputs into the apparatus during a test and receive a plurality of signals from said plurality of sensors. The plurality of signals represents measurements of the attributes of the apparatus. The system further includes a testing system computer device in communication with the testing controller. The testing system computer device includes a processor in communication with a memory. The testing system computer device is programmed to store a plurality of historical data and generate a simulation model of the apparatus based in part on the historical data. The simulation model includes a plurality of inputs and a plurality of outputs of the apparatus. The testing system computer device is also programmed to determine a plurality of tests to perform on the device based on the simulation model and the plurality of historical data, receive a plurality of desirability ratings from a user, rank the plurality of tests to perform based on the plurality of desirability ratings, and present the ranked plurality of tests to the user.

BRIEF DESCRIPTION OF THE DRAWINGS

These and other features, aspects, and advantages of the present disclosure will become better understood when the following detailed description is read with reference to the accompanying drawings in which like characters represent like parts throughout the drawings, wherein.

Unless otherwise indicated, the drawings provided herein are meant to illustrate features of embodiments of this disclosure. These features are believed to be applicable in a wide variety of systems comprising one or more embodiments of this disclosure. As such, the drawings are not meant to include all conventional features known by those of ordinary skill in the art to be required for the practice of the embodiments disclosed herein.

DETAILED DESCRIPTION

In the following specification and the claims, reference will be made to a number of terms, which shall be defined to have the following meanings.

The singular forms "a", "an", and "the" include plural references unless the context clearly dictates otherwise.

"Optional" or "optionally" means that the subsequently described event or circumstance may or may not occur, and that the description includes instances where the event occurs and instances where it does not.

Approximating language, as used herein throughout the specification and claims, may be applied to modify any quantitative representation that could permissibly vary without resulting in a change in the basic function to which it is related. Accordingly, a value modified by a term or terms, such as "about", "approximately", and "substantially", are not to be limited to the precise value specified. In at least some instances, the approximating language may correspond to the precision of an instrument for measuring the value. Here and throughout the specification and claims, range limitations may be combined and/or interchanged, such ranges are identified and include all the sub-ranges contained therein unless context or language indicates otherwise.

As used herein, the terms "processor" and "computer", and related terms, e.g., "processing device", "computing device", and controller" are not limited to just those integrated circuits referred to in the art as a computer, but broadly refers to a microcontroller, a microcomputer, a programmable logic controller (PLC), an application specific integrated circuit, and other programmable circuits, and these terms are used interchangeably herein. In the embodiments described herein, memory may include, but is not limited to, a computer-readable medium, such as a random access memory (RAM), and a computer-readable non-volatile medium, such as flash memory. Alternatively, a floppy disk, a compact disc-read only memory (CD-ROM), a magneto-optical disk (MOD), and/or a digital versatile disc (DVD) may also be used. Also, in the embodiments described herein, additional input channels may be, but are not limited to, computer peripherals associated with an operator interface such as a mouse and a keyboard. Alternatively, other computer peripherals may also be used that may include, for example, but not be limited to, a scanner. Furthermore, in the exemplary embodiment, additional output channels may include, but not be limited to, an operator interface monitor.

Further, as used herein, the terms "software" and "firmware" are interchangeable, and include any computer program stored in memory for execution by personal computers, workstations, clients and servers.

As used herein, the term "non-transitory computer-readable media" is intended to be representative of any tangible computer-based device implemented in any method or technology for short-term and long-term storage of information, such as, computer-readable instructions, data structures, program modules and sub-modules, or other data in any device. Therefore, the methods described herein may be encoded as executable instructions embodied in a tangible, non-transitory, computer readable medium, including, without limitation, a storage device and/or a memory device. Such instructions, when executed by a processor, cause the processor to perform at least a portion of the methods described herein. Moreover, as used herein, the term "non-transitory computer-readable media" includes all tangible, computer-readable media, including, without limitation, non-transitory computer storage devices, including, without limitation, volatile and nonvolatile media, and removable and non-removable media such as a firmware, physical and virtual storage, CD-ROMs, DVDs, and any other digital source such as a network or the Internet, as well as yet to be developed digital means, with the sole exception being a transitory, propagating signal.

Furthermore, as used herein, the term "real-time" refers to at least one of the time of occurrence of the associated events, the time of measurement and collection of predetermined data, the time to process the data, and the time of a system response to the events and the environment. In the embodiments described herein, these activities and events occur substantially instantaneously.

The testing system described herein provides a method for determining and updating a test plan for a device or apparatus in real-time using sensors that are monitoring tests of the device. Specifically, the embodiments described herein include a computing device that is configured to receive information about the device and generate a model of the device. The computing device uses sensor data to update the model to improve the model's accuracy. The computing device uses the model in combination with user-based test objectives to determine which of a plurality of tests are important to perform. In some embodiments, the computer device iteratively updates the model based on every test that is performed and re-determines which tests are important to perform after each model update. The systems and method described herein allow for reducing the number of tests necessary to analyze a device, thereby reducing the cost to test the device.

Figure 1:
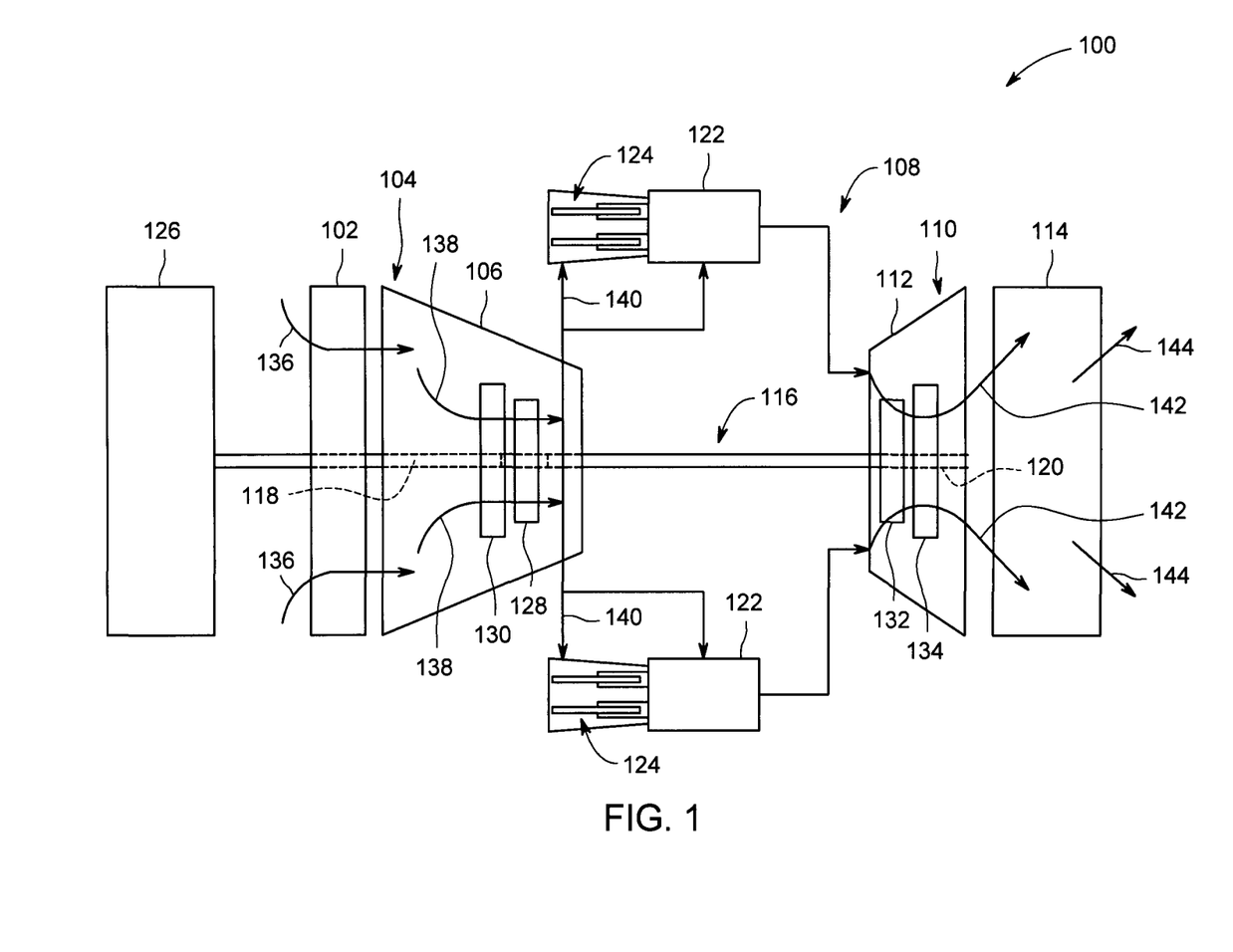
FIG. 1 is a schematic view of an asset for testing, i.e., a turbomachine, and more specifically, in the exemplary embodiment, a gas turbine engine.

FIG. 1 is a schematic view of an asset for testing, i.e., a turbomachine, and more specifically, in the exemplary embodiment, a gas turbine engine 100. Alternatively, any apparatus, system, and facility subject to testing during and/or after development, manufacture, installation, or deployment as described herein may be used, including, without limitation, combustion systems such as furnaces, gasification systems, boilers, steam turbines, geared devices, and high-temperature exhaust systems.

In the exemplary embodiment, gas turbine engine 100 includes an air intake section 102, and a compressor section 104 coupled downstream from, and in flow communication with, intake section 102. Compressor section 104 is enclosed within a compressor casing 106. A combustor section 108 is coupled downstream from, and in flow communication with, compressor section 104, and a turbine section 110 is coupled downstream from, and in flow communication with, combustor section 108. Gas turbine engine 100 is enclosed within a turbine casing 112 and includes an exhaust section 114 downstream from turbine section 110. Moreover, in the exemplary embodiment, turbine section 110 is coupled to compressor section 104 via a rotor assembly 116 that includes, without limitation, a compressor rotor, or drive shaft 118 and a turbine rotor, or drive shaft 120.

In the exemplary embodiment, combustor section 108 includes a plurality of combustor assemblies, i.e., combustors 122 that are each coupled in flow communication with compressor section 104. Combustor section 108 also includes at least one fuel nozzle assembly 124. Each combustor 122 is in flow communication with at least one fuel nozzle assembly 124. Moreover, in the exemplary embodiment, turbine section 110 and compressor section 104 are rotatably coupled to a load 126 via drive shaft 118. For example, load 126 may include, without limitation, an electrical generator or a mechanical drive application, e.g., a pump. Alternatively, gas turbine engine 100 may be an aircraft engine. In the exemplary embodiment, compressor section 104 includes at least one compressor blade assembly 128, i.e., blade 128 and at least one adjacent stationary vane assembly 130.

Also, in the exemplary embodiment, turbine section 110 includes at least one turbine blade assembly, i.e., bucket 132 and at least one adjacent stationary nozzle assembly 134. Each compressor blade assembly 128 and each turbine bucket 132 are coupled to rotor assembly 116, or, more specifically, compressor drive shaft 118 and turbine drive shaft 120.

In operation, air intake section 102 channels air 136 towards compressor section 104. Compressor section 104 compresses inlet air 136 to higher pressures and temperatures prior to discharging compressed air 138 towards combustor section 108. Compressed air 140 is channeled to fuel nozzle assembly 124, mixed with fuel (not shown), and burned within each combustor 122 to generate combustion gases 142 that are channeled downstream towards turbine section 110. Combustion gases 142 generated within combustors 122 are channeled downstream towards turbine section 110. After impinging turbine bucket 132, thermal energy is converted to mechanical rotational energy that is used to drive rotor assembly 116. Turbine section 110 drives compressor section 104 and load 126 via drive shafts 118 and 120, and exhaust gases 144 are discharged through exhaust section 114 to ambient atmosphere.

Figure 2:
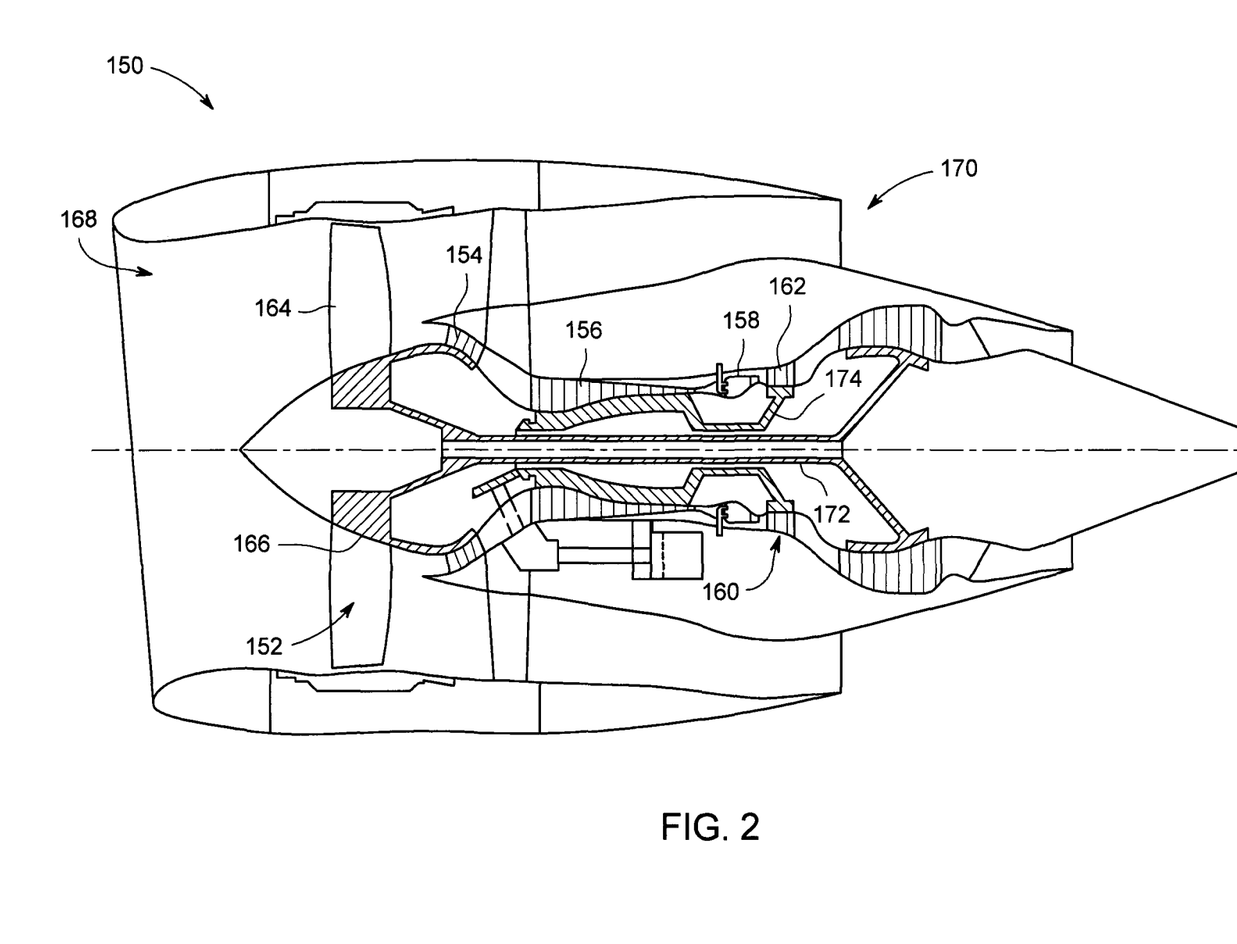
FIG. 2 is a schematic illustration of an exemplary gas turbine engine, and more specifically, in an embodiment, a jet turbine engine.

FIG. 2 is a schematic illustration of an exemplary gas turbine engine, and more specifically, in an embodiment, a jet turbine engine 150. In the exemplary embodiment, jet turbine engine 150 includes a fan assembly 152, a booster 154, a high pressure compressor 156, and a combustor 158. Jet turbine engine 150 also includes a high pressure turbine 160, and a low pressure turbine 162, all in serial flow arrangement. Fan assembly 152 includes an array of fan blades 164 extending radially outward from a rotor disk 166. Engine 150 also includes an intake side 168 and an exhaust side 170. Fan assembly 152, booster 154, and turbine 162 may be coupled by a first rotor shaft 172, and the compressor 156 and turbine 160 may be coupled by a second rotor shaft 174.

In operation, air flows through fan assembly 152 and compressed air is supplied to high pressure compressor 156 through booster 154. The highly compressed air is delivered to combustor 158, where it is mixed with a fuel and ignited to generate combustion gases. The combustion gases are channeled from the combustor 158 to drive the turbines 160 and 162. The turbine 162 drives the fan assembly 152 and booster 154 by way of shaft 172. The turbine 160 drives the compressor 156 by way of shaft 174. In at least one embodiment, the plurality of components includes blade 164.

FIGS. 1 and 2 are described for illustrative purposes to show devices (also known as apparatuses or machines) that may require testing as a part of development, manufacture, installation, or deployment. Turbine engine 100 and jet turbine engine 150 both include a plurality of components that are combined to create a finished product. Both also accept a plurality of variable inputs during operation, such as, but not limited to, gas splits, loads, speed, and firing temperature. Both engines 100 and 150 also produce a plurality of variable outputs based on the components and the plurality of variable inputs, such as, but not limited to, NOx, combustor instability, and system dynamics. Testing these engines 100 and 150 requires analysis of the response of the engine to different values for the inputs, as well as different combinations of values for the inputs.

In the exemplary embodiment, the determination of which tests to perform is made based on the attributes that the tester desires to monitor. As will be described further in this disclosure, many of the potential tests may be redundant or unnecessary based on the behavior of the device being tested and the desires of those testing the device.

Figure 3:
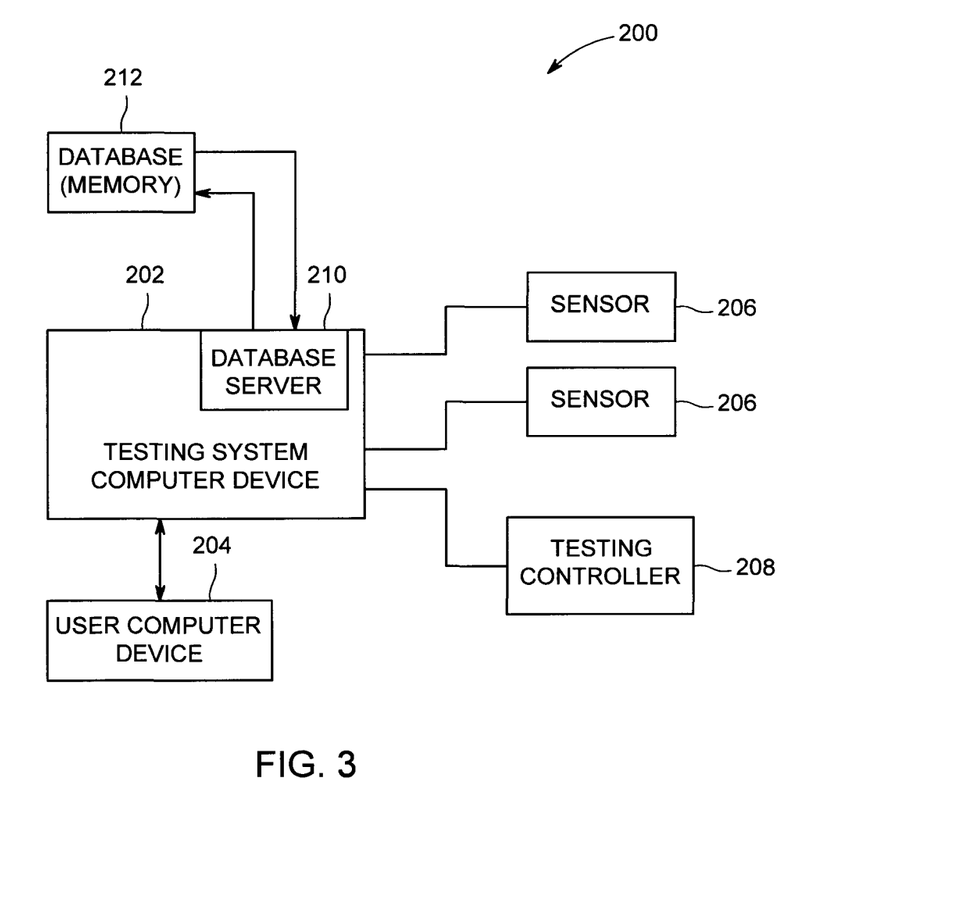
FIG. 3 is a schematic view of an exemplary testing system to dynamically update test plans for an apparatus to be tested, such as the gas turbine engine shown in FIG. 1 and the jet turbine engine shown in FIG. 2.

FIG. 3 is a schematic view of an exemplary testing system 200 to dynamically update test plans for a device to be tested, such as gas turbine engine 100 (shown in FIG. 1) and jet turbine engine 150 (shown in FIG. 2). In the exemplary embodiment, testing system 200 is used for compiling, ranking, and dynamically updating test plans for a device. Testing system 200 includes a testing system ("TS") computing device 202 configured to dynamically determine and update the test plan of a device. As described below in more detail, TS computing device 202 is configured to store a plurality of historical data, generate a simulation model of a device based in part on the historical data, where the simulation model includes a plurality of inputs and a plurality of outputs of the device, determine a plurality of tests to perform on the device based on the simulation model and the plurality of historical data, receive a plurality of desirability ratings from a user, rank the plurality of tests to perform based on the plurality of desirability ratings, and present the ranked plurality of tests to the user.

In some embodiments, TS computer device 202 is further configured to receive sensor data from a test of the device that has been performed, adjust the simulation model of the device based on the received sensor data, and re-rank the plurality of tests based on the received sensor data, the adjusted simulation model, and the plurality of desirability ratings.

In still further embodiments, TS computer device 202 is configured to receive, at each of a plurality of points in time, one or more sensor readings from an actively occurring test of the device, iteratively adjust the simulation model of the device based on the received one or more sensor readings, iteratively re-rank the plurality of tests based on the iteratively adjusted simulation model, determine an adjustment of at least one input of the plurality of inputs of the device for the actively occurring test based on the iteratively adjusted simulation model, and transmit the adjustment to a testing controller 208. Testing controller 208 adjusts the input during the actively occurring test.

In the exemplary embodiment, user computer devices 204 are computers or computer devices that include a web browser or a software application, which enables user computer devices 204 to access TS computer device 202 using the Internet. More specifically, user computer devices 204 are communicatively coupled to the Internet through various wired and wireless interfaces including, but not limited to, at least one of a network, such as the Internet, a local area network (LAN), a wide area network (WAN), or an integrated services digital network (ISDN), a dial-up-connection, a digital subscriber line (DSL), a cellular phone connection, and a cable modem. User computer devices 204 can be any device capable of accessing the Internet including, but not limited to, a desktop computer, a laptop computer, a personal digital assistant (PDA), a cellular phone, a smartphone, a tablet, or other web-based connectable equipment.

Sensors 206 are adapted to measure a parameter of interest, such as temperature, distributed temperature, pressure, acoustic energy, electric current, magnetic field, electric field, chemical properties, or a combination thereof. Such sensors 206 include pressure gauges, temperature gauges, electrical meters, nitrogen oxide (NOx) sensors, and vibration sensors. In the exemplary embodiment, sensors 206 measure the attributes of a device as the device is being tested. Sensors 206 connect to TS computer device 202 or testing controller 208 through many interfaces including without limitation a network, such as a local area network (LAN) or a wide area network (WAN), dial-in-connections, cable modems, Internet connection, wireless, and special high-speed Integrated Services Digital Network (ISDN) lines. Sensors 206 receive data about conditions of device 100 or 150 report those conditions at least to TS computer device 202 or testing controller 208. In some embodiments, sensors 206 are also in communication with other computer systems, such as, but not limited to, user computer devices 204.

In the exemplary embodiment, TS computer device 202 is also in communication with testing controller 208. In the exemplary embodiment, testing controller 208 is configured to communicate with and control device 100, while device 100 is being tested. Testing controller 208 controls the inputs into device 100, while the test is underway, based on the test plan for the test that is being performed. In the exemplary embodiment, the test plan lists the inputs into the device and their values during the test, the expected outputs, actions to be performed during the test, and the times when to perform those actions. In the exemplary embodiment, testing controller 208 receives sensor data from sensors 206 before, during, and after the test of the device. Testing controller 208 is configured to communicate with TS computer device 202 through using the Internet. In some embodiments, testing controller 208 is communicatively coupled to the Internet through many interfaces including, but not limited to, at least one of a network, such as the Internet, a LAN, a WAN, or an integrated services digital network (ISDN), a dial-up-connection, a digital subscriber line (DSL), a cellular phone connection, a satellite connection, and a cable modem. Testing controller 208 can be any device capable of accessing a network, such as the Internet, including, but not limited to, a desktop computer, a laptop computer, a personal digital assistant (PDA), a cellular phone, a smartphone, a tablet, a phablet, or other web-based connectable equipment A database server 210 is coupled to database 212, which contains information on a variety of matters, as described herein in greater detail. In one embodiment, centralized database 212 is stored on TS computer device 202. In an alternative embodiment, database 212 is stored remotely from TS computer device 202 and may be non-centralized. In some embodiments, database 212 includes a single database having separated sections or partitions or in other embodiments, database 212 includes multiple databases, each being separate from each other. Database 212 stores historical data, test plans, user desirability ratings, and sensor data. In some embodiments, a user is able to access database 212 by logging into TS computer device 202, such as through user computer device 204.

Figure 4:
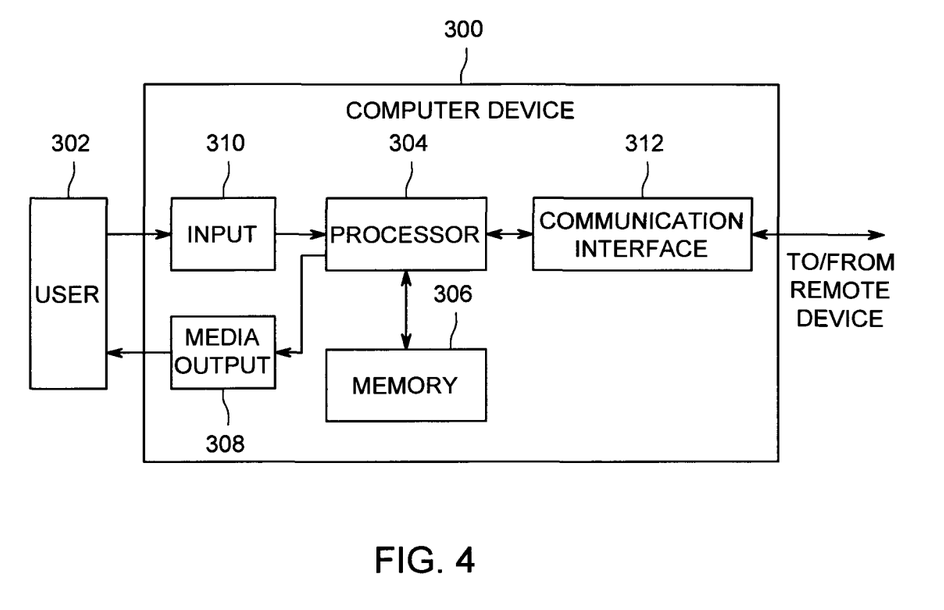
FIG. 4 is a schematic view of an exemplary configuration of a client system that may be used with the testing system shown in FIG. 3.

FIG. 4 is a schematic view of an exemplary configuration of a client system that may be used with testing system 200 (shown in FIG. 3). Computer device 300 is operated by a user 302. Computer device 300 may include, but is not limited to, testing controller 208 and user computer device 204 (both shown in FIG. 3). Computer device 300 includes a processor 304 for executing instructions. In some embodiments, executable instructions are stored in a memory area 306. Processor 304 may include one or more processing units (e.g., in a multi-core configuration). Memory area 306 is any device allowing information such as executable instructions and/or transaction data to be stored and retrieved. Memory area 306 includes one or more computer readable media. In some embodiments, memory area 306 includes database 212 (shown in FIG. 3). In some embodiments, memory area 306 is stored in computer device 300. In alternative embodiments, memory area 306 is stored remotely from computer device 300.

Computer device 300 also includes at least one media output component 308 for presenting information to user 302. Media output component 308 is any component capable of conveying information to user 302. In some embodiments, media output component 308 includes an output adapter (not shown) such as a video adapter and/or an audio adapter. An output adapter is operatively coupled to processor 304 and operatively coupled to an output device such as a display device (e.g., a cathode ray tube (CRT), liquid crystal display (LCD), light emitting diode (LED) display, or "electronic ink" display) or an audio output device (e.g., a speaker or headphones). In some embodiments, media output component 308 is configured to present a graphical user interface (e.g., a web browser and/or a client application) to user 302. In some embodiments, computer device 300 includes an input device 310 for receiving input from user 302. User 302 may use input device 310 to, without limitation, select a measured attribute to view. Input device 310 may include, for example, a keyboard, a pointing device, a mouse, a stylus, a touch sensitive panel (e.g., a touch pad or a touch screen), a gyroscope, an accelerometer, a position detector, a biometric input device, and/or an audio input device. A single component such as a touch screen may function as both an output device of media output component 308 and input device 310.

Computer device 300 may also include a communication interface 312, communicatively coupled to a remote device such as sensor 206 (shown in FIG. 3). Communication interface 312 may include, for example, a wired or wireless network adapter and/or a wireless data transceiver for use with a mobile telecommunications network or a local area network.

Stored in memory area 306 are, for example, computer readable instructions for providing a user interface to user 302 via media output component 308 and, optionally, receiving and processing input from input device 310. A user interface may include, among other possibilities, a web browser and/or a client application. Web browsers enable users, such as user 302, to display and interact with media and other information typically embedded on a web page or a website. A client application allows user 302 to interact with, for example, TS computer device 202 (shown in FIG. 3). For example, instructions may be stored by a cloud service, and the output of the execution of the instructions sent to the media output component 308.

Processor 304 executes computer-executable instructions for implementing aspects of the disclosure. In some embodiments, processor 304 is transformed into a special purpose microprocessor by executing computer-executable instructions or by otherwise being programmed. For example, processor 304 is programmed with instructions discussed further below.

Figure 5:
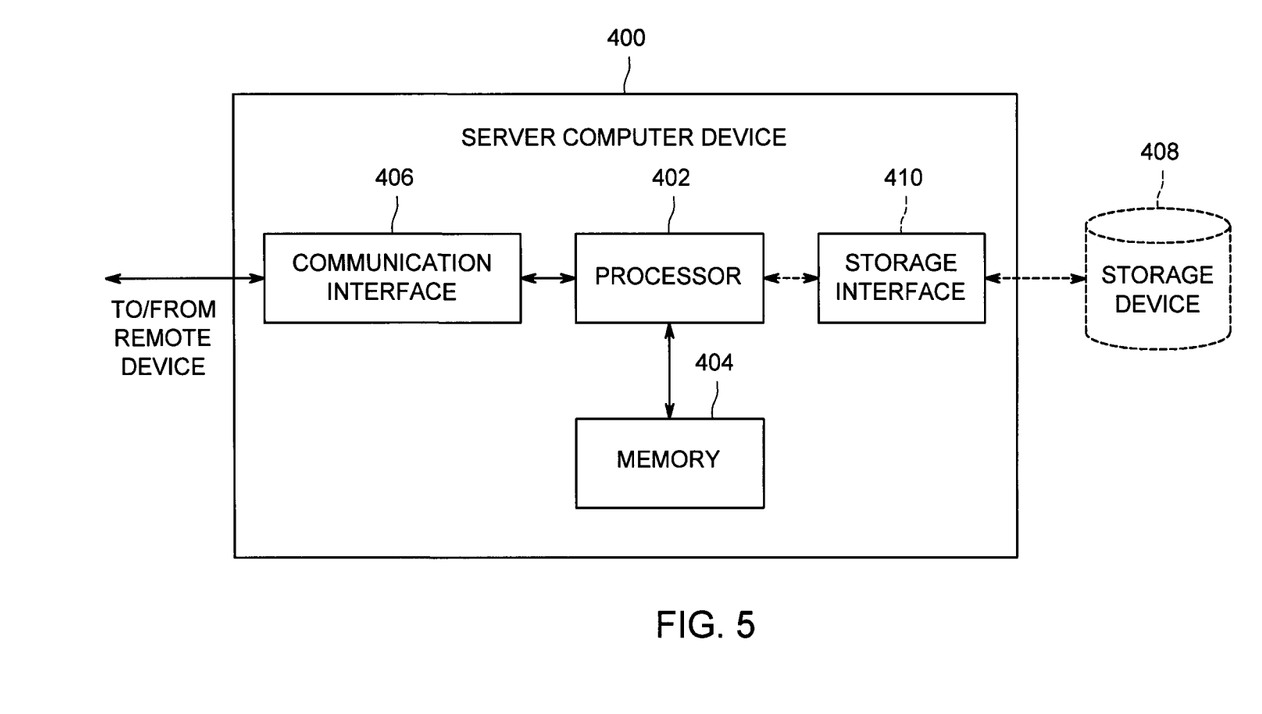
FIG. 5 is a schematic view of an exemplary configuration of a testing system computer device that may be used with the testing system shown in FIG. 3.

FIG. 5 is a schematic view of an exemplary configuration of TS computer device 202 that may be used with the testing system 200 (both shown in FIG. 3). More specifically, server computer device 400 may include, but is not limited to, TS computer device 202, testing controller 208, and database server 210 (both shown in FIG. 3). Server computer device 400 also includes a processor 402 for executing instructions. Instructions may be stored in a memory area 404. Processor 402 may include one or more processing units (e.g., in a multi-core configuration).

Processor 402 is operatively coupled to a communication interface 406 such that server computer device 400 is capable of communicating with a remote device, such as another server computer device 400, sensors 206 (shown in FIG. 3), TS computer device 202, testing controller 208, or user computer devices 204 (shown in FIG. 3). For example, communication interface 406 may receive requests from user computer device 204, as illustrated in FIG. 3.

Processor 402 is also operatively coupled to a storage device 408. Storage device 408 is any computer-operated hardware suitable for storing and/or retrieving data, such as, but not limited to, data associated with database 212 (shown in FIG. 3). In some embodiments, storage device 408 is integrated in server computer device 400. For example, server computer device 400 may include one or more hard disk drives as storage device 408. In other embodiments, storage device 408 is external to server computer device 400 and is accessed by a plurality of server computer device 400. For example, storage device 408 may include a storage area network (SAN), a network attached storage (NAS) system, and/or multiple storage units such as hard disks and/or solid state disks in a redundant array of inexpensive disks (RAID) configuration.

In some embodiments, processor 402 is operatively coupled to storage device 408 via a storage interface 410. Storage interface 410 is any component capable of providing processor 402 with access to storage device 408. Storage interface 410 may include, for example, an Advanced Technology Attachment (ATA) adapter, a Serial ATA (SATA) adapter, a Small Computer System Interface (SCSI) adapter, a RAID controller, a SAN adapter, a network adapter, and/or any component providing processor 402 with access to storage device 408.

Processor 402 executes computer-executable instructions for implementing aspects of the disclosure. In some embodiments, the processor 402 is transformed into a special purpose microprocessor by executing computer-executable instructions or by otherwise being programmed. For example, the processor 402 is programmed with instructions as described further below.

Figure 6:
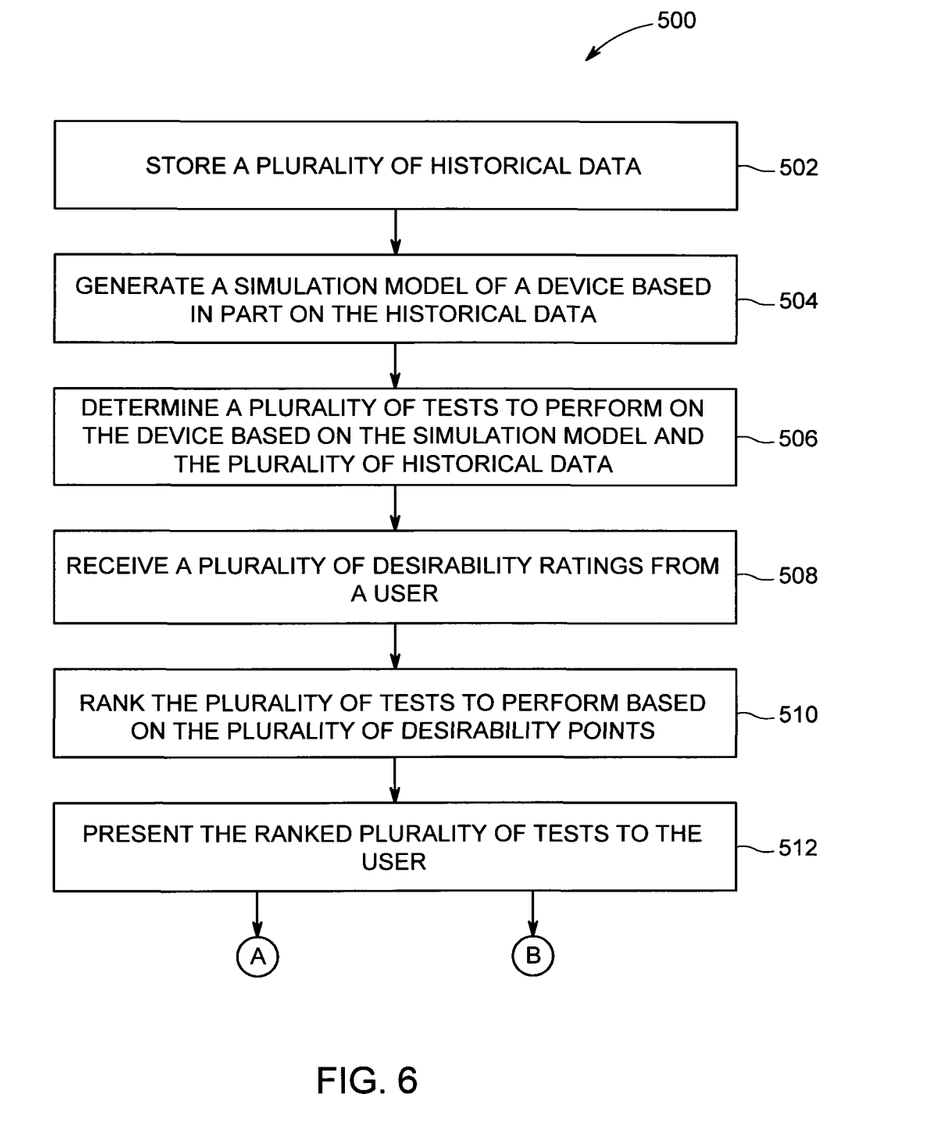
FIG. 6 is a flow chart of an exemplary process of dynamically generating and determining which tests to perform on an apparatus, such as the gas turbine engine shown in FIG. 1 and the jet turbine engine shown in FIG. 2.

FIG. 6 is a flow chart of an exemplary process 500 of dynamically generating and determining which tests to perform on a device, such as gas turbine engine 100 (shown in FIG. 1) and jet turbine engine (shown in FIG. 2). In the exemplary embodiment, process 500 is performed by TS computer device 202 (shown in FIG. 3).

In the exemplary embodiment, TS computer device 202 stores 502 a plurality of historical data. In the exemplary embodiment, TS computer device 202 stores 502 the historical data in database 212 (shown in FIG. 3). The historical data contains information on past tests and performance parameters of devices similar to the device that is to be tested, such as legacy data from previous versions or models of the device.

TS computer device 202 generates 504 a simulation model of the device based in part on the historical data. TS computer device 202 may also include, expert judgment, past models, and other information used in generating 504 the simulation model. The simulation model is designed to be a virtual simulation of the device to be tested, including inputs and outputs. The first iteration of the simulation model may also be based off of user input, where the user is an expert that determines how the device is expected to behave. In the exemplary embodiment, the simulation model determines expected outcomes or output values based on the inputs. The simulation model also determines the uncertainty for these outputs. This represents the level of confidence that the simulation model has that the output is correct. As described below, as TS computer device 202 receives more information about the actual device, such as through actual tests, TS computer device 202 adjusts the simulation model and updates the outputs of the simulation model and the associated uncertainty. As the simulation model iteratively updates, the uncertainty associated with the outputs is reduced as the simulation model becomes more accurate.

TS computer device 202 determines 506 a plurality of tests to perform on the device based on the simulation model and the plurality of historical data. This plurality of tests constitutes the test plan for the device. In the exemplary embodiment, TS computer device 202 determines 506 the first iteration of the test plan based on historical tests. In some embodiments, TS computer device 202 simulates the plurality of tests on the simulation model to refine one or more of the plurality of tests.

In some embodiments, after one or more tests are completed, TS computer device 202 analyzes the outputs based on uncertainty. In some embodiments, TS computer device 202 determines the area of highest uncertainty. Based on the area of highest uncertainty, TS computer device 202 generates one or more tests to include inputs clustered around this area of highest uncertainty. For example, for a set of inputs that range from 0 to 100, the highest uncertainty may be between 75 to 85. TS computer device 202 generates one or more tests that include a clustering of inputs around the 75 to 85 range. In this manner, TS computer device 202 concentrates testing on the areas that have the largest deviation between the model and the actual sensor readings. By specifically testing the areas of high uncertainty, TS computer device 202 increases the resolution and accuracy of the simulation model in those areas, thereby reducing the uncertainty. TS computer device 202 updates the test plan based on the newly generated one or more tests. Based on the results of the one or more tests, TS computer device 202 updates the simulation model and then is able to update the test plan based on the updated simulation model.

In some further embodiment, TS computer device 202 determines an area of uncertainty during a test. In these embodiments, TS computer device 202 adjusts the inputs based on the area of uncertainty to receive results to clarify that area.

In some further embodiments, TS computer device 202 iteratively combines multiple tests from the plurality of tests, so that the combined tests will analyze multiple factors. This is designed to improve the efficiency of the testing so that multiple factors will be analyzed in a single test rather than only analyzing one or two factors at a time. For example, in the first iteration, each of the plurality of tests only examines one factor. TS computer device 202 iteratively analyzes the plurality of tests, groups the plurality of tests, and combines the groups so that each test may test multiple factors. TS computer device 202 may complete multiple iterations of analyzing, grouping, and combining. For example, TS computer device 202 may group and combine multiple tests with similar inputs that are testing different factors, which have the same testing set-up or testing rig. In some embodiments, the single factor tests are combined to prevent test points that are beyond the operational limits of the device. In at least one embodiment, the test plan and the simulation model are designed using Intelligent Design and Analysis of Computer Experiments (IDACE) method and Bayesian Hybrid Models (BHM).

In the exemplary embodiment, TS computer device 202 receives 508 a plurality of desirability ratings from a user, such as a test director. Each of the desirability ratings includes a factor, threshold, constraint, goal, or objective that is important to the user for testing. Some examples of desirability ratings include, but are not limited to, emissions thresholds, maximum and minimum loads, efficiency ratings, test objectives, test goals, constraints, critical-to-quality (CTQ) factors, desired input values to be tested, test points, and testing budget. For example, a user may have an expected load range for a device, such as a turbine. User enters the load range as desirability ratings for the testing of the device. TS computer device 202 analyzes the desirability ratings in view of the simulation model and prioritizes tests in the test plan to test the load range and reduce uncertainty around that load range. TS computer device 202 reduces the priority of tests associated with values far outside of the desired load range.

In some embodiments, each of the plurality of desirability ratings represents a single test point, such as a desired output of the test. In some embodiments, TS computer device 202 may further combine some of the plurality of tests based on the plurality of desirability ratings.

Also in the exemplary embodiment, TS computer device 202 ranks 510 the plurality of tests to perform based on the plurality of desirability ratings. In this embodiment, TS computer device 202 compares each test to the plurality of desirability ratings to determine a desirability of the corresponding test. For example, each test is analyzed based on the inputs and outputs being within or near desirability ratings. TS computer device 202 prioritizes tests with more inputs and/or outputs closer to the desirability ratings higher than those that do not test values near the desirability ratings. In some embodiments, TS computer device 202 also adjusts the plurality of tests based on the desirability ratings, so that tests may be recombined to improve the desirability of the combined test. In some embodiments, TS computer device 202 ranks 510 the plurality of tests to optimize the ordering of the tests in the test plan. This can be used to maximize the number of test points with high desirability given a limited budget. TS computer device 202 may also rank 510 the tests based on the transition time between adjacent test points to minimize the number of labor hours to perform the test or transition between test points.

Further in the exemplary embodiment, TS computer device 202 provides 512 the ranked plurality of tests to the user. For example, TS computer device 202 transmits the ranked plurality of tests to user computer device 204 (shown in FIG. 3), which then displays the ranked plurality of tests to the user.

In some embodiments, each test includes a cost and a time to complete. In these embodiments, TS computer device 202 ranks 510 the plurality of tests based on at least one of the cost and the time to complete. In some further embodiments, the plurality of desirability ratings includes a total budget for testing. In these embodiments, TS computer device 202 ranks 510 the plurality of tests based on the total budget. For example, TS computer device 202 determines which tests of the plurality of tests may be performed within the total budget based on the cost associated with each test. In some further embodiments, TS computer device 202 determines the tests to be performed based on both the cost and the desirability of the test. In other embodiments, TS computer device 202 determines the tests to be performed based on both the time to complete the test and the desirability of the test. TS computer device 202 may also combine or recombine multiple test based on the cost and/or the time to perform.

Figure 7:
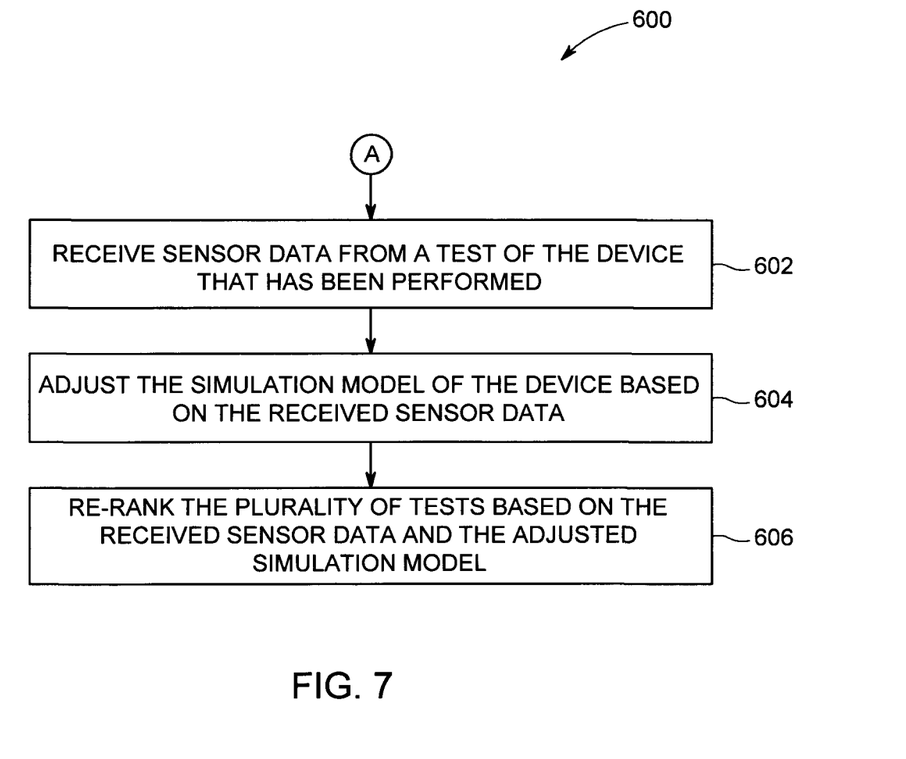
FIG. 7 is a flow chart of an exemplary process of dynamically updating a test plan using the testing system shown in FIG. 3.

FIG. 7 is a flow chart of an exemplary process 600 of dynamically updating a test plan using testing system 200 (shown in FIG. 3). In the exemplary embodiment, process 600 is performed by TS computer device 202 (shown in FIG. 3). Process 600 is performed after process 500 (shown in FIG. 6) is complete, where the user has selected a test to perform of the plurality of tests and has performed the test in question. In the exemplary embodiment, the test was performed on the device by testing controller 208 (shown in FIG. 3).

Also in the exemplary embodiment, TS computer device 202 receives 602 sensor data from a test of the device that has been completed. In some embodiments, TS computer device 202 receives 602 the sensor data directly from sensors 206 (shown in FIG. 3). In other embodiments, TS computer device 202 receives 602 the sensor data from testing controller 208, which received the sensor data from sensors 206. Sensor data may include all or part of the measurements performed during the test.

Further in the exemplary embodiment, TS computer device 202 adjusts 604 the simulation model of the device based on the received sensor data. TS computer device 202 compares the received sensor data to the expected results of the test to determine the differences and adjusts 604 the simulation model accordingly. In some embodiments, TS computer device 202 also receives the inputs of the device during the test and enters those inputs into the simulation model. Then TS computer device 202 compares the outputs of the simulation model from the above step with the received sensor data. TS computer device 202 adjusts 604 the simulation model based on the comparison to bring the simulation model more in line with the behavior and attributes of the actual device. This also reduces the uncertainty of outputs as the actual combinations of inputs and outputs from the device are integrated into the simulation model.

Moreover in the exemplary embodiment, TS computer device 202 re-ranks 606 the plurality of tests based on the received sensor data and the adjusted simulation model. In some embodiments, TS computer device 202 reanalyzes each test based on adjusted simulation model and the plurality of desirability ratings to determine an updated desirability of the corresponding test. In some further embodiments, TS computer device 202 may also recombine some of the plurality of tests to improve the desirability of the combined test.

In addition in the exemplary embodiment, every time a test is completed, TS computer device 202 performs process 600 based on the results of the test to iteratively adjust the simulation model and the rankings. In this way, the simulation model is iteratively improved based on test information.

In some embodiments, as the simulation model is updated, the uncertainty associated with some of the outputs may be reduced. As the uncertainty of certain outputs is reduced to below a predetermined threshold the desirability of tests associated with those certain outputs may be reduced. Thus TS computer device 202 may re-rank those tests in lower positions as those tests become less necessary based on the improved accuracy of the model.

Figure 8:
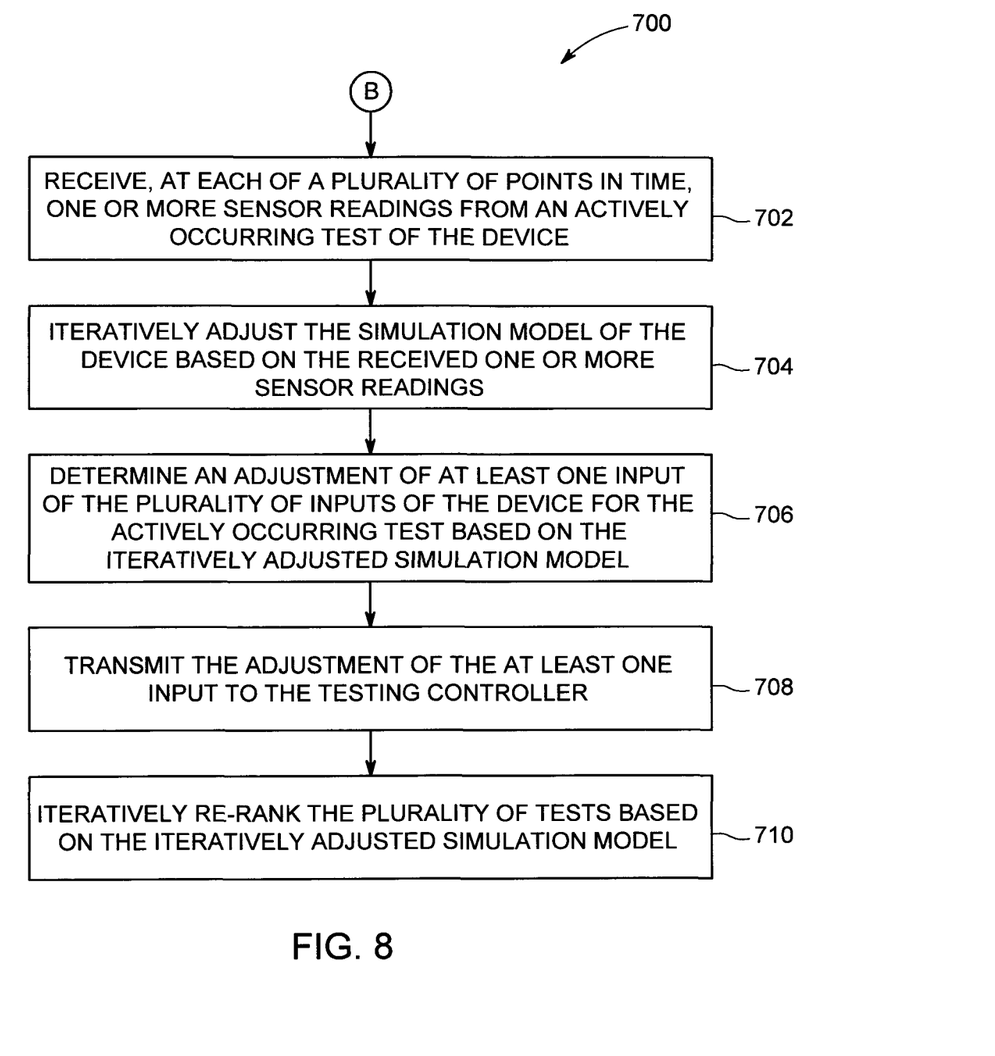
FIG. 8 is a flow chart of an exemplary process of dynamically adjusting a test plan while the test is executing using the testing system shown in FIG. 3.

FIG. 8 is a flow chart of an exemplary process 700 of dynamically adjusting a test plan while the test is executing using testing system 200 (shown in FIG. 3). In the exemplary embodiment, process 700 is performed by TS computer device 202 (shown in FIG. 3). Process 700 is performed after process 500 (shown in FIG. 6) is complete, where the user has selected a test to perform of the plurality of tests and is in the process of performing the selected test on the device. In the exemplary embodiment, the test is being performed on the device by testing controller 208 (shown in FIG. 3).

Also in the exemplary embodiment, TS computer device 202 receives 702 sensor data from a test of the device that is being performed. In some embodiments, TS computer device 202 receives 702 the sensor data directly from sensors 206 (shown in FIG. 3). In other embodiments, TS computer device 202 receives 702 the sensor data from testing controller 208, which received the sensor data from sensors 206. In the exemplary embodiment, the sensor data includes a plurality of measurements from a plurality of different sensors 206 around the device at a point in time during an actively occurring test.

TS computer device 202 adjusts 704 the simulation model of the device based on the received sensor readings. TS computer device 202 compares the received sensor data to the expected results of the test to determine the differences and adjusts 704 the simulation model accordingly. In some embodiments, TS computer device 202 also receives the inputs of the device during the test and enters those inputs into the simulation model. Then TS computer device 202 compares the outputs of the simulation model from the above step with the received sensor data. TS computer device 202 adjusts 704 the simulation model based on the comparison to bring the simulation model more in line with the behavior and attributes of the actual device. This also reduces the uncertainty of outputs as the actual combinations of inputs and outputs from the device are integrated into the simulation model.

TS computer device 202 determines 706 an adjustment of at least one input of the plurality of inputs of the device for the actively occurring test based on the simulation model. For example, TS computer device 202 determines that based on the received sensor readings, the model predicts a high degree of uncertainty related to one or more of the inputs. TS computer device 202 adjusts at least one of the one or more inputs of the device based on that uncertainty to receive additional sensor readings to adjust 704 the simulation model with to reduce the uncertainty. For example, TS computer device 202 receives sensor readings with temperature readings that are different than expected based on the current inputs. When TS computer device 202 adjusts 704 the simulation model based on the received temperature readings, TS computer device 202 calculates areas of uncertainty based on the simulation model. These areas of uncertainty demonstrate that the simulation model is uncertain about what the outputs would be based on one or more inputs. TS computer device adjusts the inputs of the device to test those combinations of inputs to determine what the temperature will be and clarify the simulation model.

TS computer device 202 transmits 708 the adjustment of the at least one input to testing controller 208. Testing controller 208 adjusts the at least one input in the actively occurring test based on the adjustment. In some embodiments, TS computer device 202 determines that there is a potentially dangerous condition and instructs testing controller 208 to end the test. In other embodiments, TS computer device 202 determines that the test is no longer necessary or that the objectives of the test have been achieved and instructs testing controller 208 to end the test. For example, TS computer device 202 may determine that the uncertainty based on the test points of the test has been be reduced to below the desired threshold or has reached a steady state, so that the particular test or test set-up is no longer necessary. This may save time and money based on how much longer the test was planned to take.

In the exemplary embodiment, TS computer device 202 re-ranks 710 the plurality of tests based on the adjusted simulation model. In some embodiments, TS computer device 202 reanalyzes each test based on adjusted simulation model and the plurality of desirability ratings to determine an updated desirability of the corresponding test.

In the exemplary embodiment, TS computer device 202 receives 702 sensor data at a plurality of points in time during the performance of the test. At each of the plurality of points in time, TS computer device 202 performs all or part of process 700. This allows for iterative readjustment of the test as it is being performed and iterative adjustment of the simulation model based on how the device actually performs.

The above-described method and systems provides a method for determining and updating a test plan for a device in real-time using sensors that are monitoring tests of the device. Specifically, the embodiments described herein include a computing device that is configured to receive information about the device and generate a model of the device. The computing device uses sensor data to update the model to improve the model's accuracy. The computing device uses the model in combination with user-based test objectives to determine which of a plurality of tests are important to perform. In some embodiments, the computer device iteratively updates the model based on every test that is performed and re-determines which tests are important to perform after each model update. The systems and method described herein allow for reducing the number of test necessary to analyze a device, thereby reducing the cost to test the device.

An exemplary technical effect of the methods, systems, and apparatus described herein includes at least one of: (a) determining a test plan for a device; (b) determining multi-factor tests for the device to reduce the number of required tests; (c) reducing the cost of testing by combining tests and identifying unnecessary tests; (d) generating and updating a model of the device based on past information and test results; (e) allowing tests to be updated as they are occurring to prevent resets or premature shutdowns; (0 modifying test plans in real-time based on test results; (g) reducing the total time required for testing a device; and (h) reducing the number of set-ups needed to test a device.

Exemplary embodiments of methods, systems, and apparatus for dynamically updating test plans for a device are not limited to the specific embodiments described herein, but rather, components of systems and/or steps of the methods may be utilized independently and separately from other components and/or steps described herein. For example, the methods may also be used in combination with other systems requiring multiple tests to test multiple potential conditions and combinations of inputs, and are not limited to practice with only the systems and methods as described herein. Rather, the exemplary embodiment can be implemented and utilized in connection with many other applications, equipment, and systems that may benefit from dynamic test plans.

Although specific features of various embodiments of the disclosure may be shown in some drawings and not in others, this is for convenience only. In accordance with the principles of the disclosure, any feature of a drawing may be referenced and/or claimed in combination with any feature of any other drawing.

Some embodiments involve the use of one or more electronic or computing devices. Such devices typically include a processor, processing device, or controller, such as a general purpose central processing unit (CPU), a graphics processing unit (GPU), a microcontroller, a reduced instruction set computer (RISC) processor, an application specific integrated circuit (ASIC), a programmable logic circuit (PLC), a field programmable gate array (FPGA), a digital signal processing (DSP) device, and/or any other circuit or processing device capable of executing the functions described herein. The methods described herein may be encoded as executable instructions embodied in a computer readable medium, including, without limitation, a storage device and/or a memory device. Such instructions, when executed by a processing device, cause the processing device to perform at least a portion of the methods described herein. The above examples are exemplary only, and thus are not intended to limit in any way the definition and/or meaning of the term processor and processing device.

Although specific features of various embodiments of the disclosure may be shown in some drawings and not in others, this is for convenience only. In accordance with the principles of the disclosure, any feature of a drawing may be referenced and/or claimed in combination with any feature of any other drawing.

This written description uses examples to disclose the embodiments, including the best mode, and also to enable any person skilled in the art to practice the embodiments, including making and using any devices or systems and performing any incorporated methods. The patentable scope of the disclosure is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal language of the claims.

What is claimed is:

1. A testing system computer device for dynamically updating a test plan of an apparatus, said testing system computer device comprising at least one processor in communication with at least one memory device, said testing system computer device configured to:
   generate a simulation model of the apparatus based in part on a plurality of historical data, wherein the simulation model includes a plurality of inputs and a plurality of outputs of the apparatus;
   determine a plurality of tests to perform on the apparatus based on the simulation model and the plurality of historical data; receive a plurality of desirability ratings;
   rank the plurality of tests to perform to generate a first ordered set of tests, wherein the first ordered set of tests is based on the plurality of desirability ratings;
   receive sensor data from a first test of the apparatus;
   determine a first area of uncertainty based on the simulation model and the sensor data, wherein the first area of uncertainty exceeds a predetermined threshold;
   determine one or more additional tests which includes one or more inputs associated with the first area of uncertainty, wherein the one or additional tests includes a second test which includes a plurality of input values;
   rank the plurality of tests to generate a second ordered set of tests which include the one or more additional tests;
   receive sensor data from the second test of the apparatus;
   execute the simulation model using the plurality of input values to generate a plurality of expected outputs;
   compare the received sensor data from the second test of the apparatus to the plurality of expected outputs;
   adjust the simulation model based on the comparison such that the first area of uncertainty no longer exceeds the predetermined threshold;
   rank the plurality of tests to generate a third ordered set of tests, wherein the one or more additional tests are ranked into lower positions than in the second ordered set of tests; and
   present the third ordered set of tests to a user.

2. A testing system computer device in accordance with claim 1, wherein the first test of the apparatus has been completed, and wherein said testing system computer device is further configured to:
   rank the plurality of tests to generate the second ordered set of tests based on the received sensor data and the plurality of desirability ratings.

3. A testing system computer device in accordance with claim 2, wherein the first area of uncertainty represents one or more inputs into the simulation model with a low level of confidence in an accuracy of one or more outputs of the simulation model based on the one or more inputs, and wherein said testing system computer device is further configured to:
   adjust the simulation model of the apparatus based on the received sensor data; and
   recalculate a level of confidence associated with the first area of uncertainty based on the adjusted simulation model.

4. A testing system computer device in accordance with claim 1, wherein said testing system computer device is further configured to:
   receive, at each point in time of a plurality of points in time, one or more sensor readings from an actively occurring test of the apparatus; and
   iteratively adjust the simulation model of the apparatus based on the received one or more sensor readings.

5. A testing system computer device in accordance with claim 4, wherein said testing system computer device is further configured to iteratively rank the plurality of tests based on the iteratively adjusted simulation model.

6. A testing system computer device in accordance with claim 4, wherein said testing system computer device is in communication with a testing controller that is controlling the actively occurring test of the apparatus, and wherein said testing system computer device is further configured to:
   determine an adjustment of at least one input of the plurality of inputs of the apparatus for the actively occurring test based on the iteratively adjusted simulation model; and
   transmit the adjustment of the at least one input to said testing controller, wherein said testing controller adjusts the at least one input during the actively occurring test.

7. A testing system computer device in accordance with claim 1, wherein each test of the plurality of tests includes a cost and a time to complete, and wherein said testing system computer device is further configured to rank the plurality of tests based on at least one of the cost and the time to complete.

8. A testing system computer device in accordance with claim 7, wherein the plurality of desirability ratings includes at least one of a cost budget and a total testing time, and wherein said testing system computer device is further configured to rank the plurality of tests based on at least one of the cost budget and the total testing time.

9. A method for dynamically updating a test plan of an apparatus, said method implemented using a testing system computer device, said testing system computer device including a processor in communication with a memory, said method comprising:
   generating, by the processor, a simulation model of the apparatus based in part on a plurality of historical data, wherein the simulation model includes a plurality of inputs and a plurality of outputs of the apparatus;

determining, by the processor, a plurality of tests to perform on the apparatus based on the simulation model and the plurality of historical data;

receiving, by the processor, a plurality of desirability ratings;

ranking, by the processor, the plurality of tests to perform to generate a first ordered set of tests, wherein the first ordered set of tests is based on the plurality of desirability ratings;

receiving sensor data from a first test of the apparatus;

determining a first area of uncertainty based on the simulation model and the sensor data, wherein the first area of uncertainty exceeds a predetermined threshold;

determining one or more additional tests which includes one or more inputs associated with the first area of uncertainty, wherein the one or additional tests includes a second test which includes a plurality of input values;

ranking the plurality of tests to generate the second ordered set of tests which include the one or more additional tests;

receiving sensor data from a second test of the apparatus;

executing the simulation model using the plurality of input values to generate a plurality of expected outputs;

comparing the received sensor data from the second test of the apparatus to the plurality of expected outputs;

adjusting the simulation model based on the comparison such that the first area of uncertainty no longer exceeds the predetermined threshold;

ranking the plurality of tests to generate a third ordered set of tests, wherein the one or more additional tests are ranked into lower positions than in the second ordered set of tests; and presenting the third ordered set of tests to a user.

10. A method in accordance with claim 9, wherein the first test of the apparatus has been completed, and wherein the method further comprises:

the plurality of tests to generate the second ordered set of tests based on the received sensor data and the plurality of desirability ratings.

11. A method in accordance with claim 10, wherein the first area of uncertainty represents one or more inputs into the simulation model with a low level of confidence in an accuracy of one or more outputs of the simulation model based on the one or more inputs, and wherein the method further comprises:

adjusting the simulation model of the apparatus based on the received sensor data; and recalculating a level of confidence associated with the first area of uncertainty based on the adjusted simulation model.

12. A method in accordance with claim 9 further comprising:

receiving, at each point in time of a plurality of points in time, one or more sensor readings from an actively occurring test of the apparatus; and iteratively adjusting the simulation model of the apparatus based on the received one or more sensor readings.

13. A method in accordance with claim 12 further comprising iteratively ranking the plurality of tests based on the iteratively adjusted simulation model.

14. A method in accordance with claim 12 further comprising:

determining an adjustment of at least one input of the plurality of inputs of the apparatus for the actively occurring test based on the iteratively adjusted simulation model; and transmitting, to a testing controller that is controlling the actively occurring test of the apparatus, the adjustment of at least one input to the testing controller, wherein the testing controller adjusts the at least one input during the actively occurring test.

15. A method in accordance with claim 9, wherein each test of the plurality of tests includes a cost and a time to complete, and wherein said method further comprises ranking the plurality of tests based on at least one of the cost and the time to complete.

16. A method in accordance with claim 15, wherein the plurality of desirability ratings includes at least one of a cost budget and a total testing time, and wherein said method further comprises ranking the plurality of tests based on at least one of the cost budget and the total testing time.

17. A system for dynamically updating a test plan of an apparatus, said system comprising:

a testing controller in communication with a plurality of sensors, wherein said testing controller comprises a processor in communication with a memory, wherein said testing controller is programmed to:

control a plurality of inputs into the apparatus during a test; and receive a plurality of signals from the plurality of sensors, wherein the plurality of signals represents measurements of attributes of the apparatus; and a testing system computer device in communication with said testing controller, wherein said testing system computer device includes a processor in communication with a memory device, wherein said testing system computer device is programmed to:

generate a simulation model of the apparatus based in part on a plurality of historical data, wherein the simulation model includes a plurality of inputs and a plurality of outputs of the apparatus;

determine a plurality of tests to perform on the apparatus based on the simulation model and the plurality of historical data;

receive a plurality of desirability ratings;

rank the plurality of tests to generate a first ordered set of tests, wherein the first ordered set of tests is to perform based on the plurality of desirability ratings;

receive sensor data from a first test of the apparatus;

determine a first area of uncertainty based on the simulation model and the sensor data, wherein the first area of uncertainty exceeds a predetermined threshold;

determine one or more additional tests which includes one or more inputs associated with the first area of uncertainty, wherein the one or additional tests includes a second test which includes a plurality of input values;

rank the plurality of tests to generate a second ordered set of tests which include the one or more additional tests;

receive sensor data from the second test of the apparatus;

execute the simulation model using the plurality of input values to generate a plurality of expected outputs;

compare the received sensor data from the second test of the apparatus to the plurality of expected outputs;

adjust the simulation model based on the comparison such that the first area of uncertainty no longer exceeds the predetermined threshold;

rank the plurality of tests to generate a third ordered set of tests, wherein the one or more additional tests are ranked into lower positions than in the second ordered set of tests; and present the third ordered set of tests to a user.

18. A system in accordance with claim 17, wherein said testing controller is programmed to transmit, to said testing system computer device, at each point in time of a plurality of points in time, one or more sensor readings based on the plurality of signals from the plurality of sensors from an actively occurring test of the apparatus, and wherein said testing system computer device is further programmed to:

receive, at each point in time of the plurality of points in time, the one or more sensor readings from an actively occurring test of the apparatus; and iteratively adjust the simulation model of the apparatus based on the received one or more sensor readings.

19. A system in accordance with claim 18, wherein said testing system computer device is further configured to iteratively rank the plurality of tests based on the iteratively adjusted simulation model.

20. A system in accordance with claim 18, wherein said testing system computer device is further configured to:

determine an adjustment of at least one input of the plurality of inputs of the apparatus for the actively occurring test based on the iteratively adjusted simulation model; and transmit the adjustment of the at least one input to said testing controller.

21. A system in accordance with claim 20, wherein said testing controller is further programmed to:

receive the adjustment of the at least one input from the testing system computer device; and adjust the at least one input of the apparatus during the actively occurring test.

\* \* \* \* \*